United States Patent
Matsuura et al.

(10) Patent No.: US 8,258,508 B2
(45) Date of Patent: Sep. 4, 2012

(54) ANODE STRUCTURE FOR USE IN ORGANIC EL DEVICE, PRODUCTION METHOD THEREOF AND ORGANIC EL DEVICE

(75) Inventors: Yoshinori Matsuura, Kawagoe (JP); Nobuyuki Kawai, Ageo (JP); Takashi Kubota, Toda (JP)

(73) Assignee: Mitsui Mining & Smelting Co., Ltd., Shinagawa-Ku (JP)

( * ) Notice: Subject to any disclaimer, the term of this patent is extended or adjusted under 35 U.S.C. 154(b) by 0 days.

(21) Appl. No.: 13/203,623

(22) PCT Filed: Jul. 9, 2010

(86) PCT No.: PCT/JP2010/061706
§ 371 (c)(1),
(2), (4) Date: Aug. 26, 2011

(87) PCT Pub. No.: WO2011/016312
PCT Pub. Date: Feb. 10, 2011

(65) Prior Publication Data
US 2011/0309349 A1    Dec. 22, 2011

(30) Foreign Application Priority Data
Aug. 7, 2009 (JP) ................. 2009-184985

(51) Int. Cl.
*H01L 51/00* (2006.01)
(52) U.S. Cl. .......... 257/40; 257/E51.018; 257/E51.038; 438/99
(58) Field of Classification Search .......... None
See application file for complete search history.

(56) References Cited

U.S. PATENT DOCUMENTS

| | | | | |
|---|---|---|---|---|
| 5,853,905 A * | 12/1998 | So et al. | ......... | 428/690 |
| 6,488,555 B2 * | 12/2002 | Pichler et al. | ......... | 445/24 |
| 7,038,374 B2 * | 5/2006 | Yamazaki et al. | ......... | 313/506 |
| 7,759,856 B2 * | 7/2010 | Sarma et al. | ......... | 313/504 |
| 7,851,814 B2 * | 12/2010 | Vaufrey et al. | ......... | 257/98 |
| 8,049,421 B2 * | 11/2011 | Yamazaki et al. | ......... | 313/506 |
| 2002/0011782 A1 * | 1/2002 | Lee et al. | ......... | 313/504 |
| 2004/0012331 A1 * | 1/2004 | Yamazaki et al. | ......... | 313/506 |
| 2004/0108810 A1 * | 6/2004 | Tsujimura et al. | ......... | 313/506 |
| 2006/0132026 A1 | 6/2006 | Sarma et al. | | |
| 2006/0240280 A1 * | 10/2006 | Liao et al. | ......... | 428/690 |
| 2006/0246290 A1 | 11/2006 | Oda et al. | | |
| 2009/0015153 A1 | 1/2009 | Asano | | |

FOREIGN PATENT DOCUMENTS

| | | |
|---|---|---|
| JP | 64-017394 A1 | 1/1989 |
| JP | 07-130468 A1 | 5/1995 |
| JP | 2001-176663 A1 | 6/2001 |

(Continued)

*Primary Examiner* — Benjamin Sandvik
(74) *Attorney, Agent, or Firm* — Burr & Brown (57) ABSTRACT

The present invention relates to an anode structure for use in a top-emission type organic EL device which comprises a laminated structure comprising an anode layer made of at least one selected from the group consisting of aluminum, aluminum alloys, silver and silver alloys; and a buffer layer directly provided on the anode layer and made of an electrically conductive amorphous carbon having a hydrogen concentration of 15 at. % or less. According to the present invention, there is provided an anode structure which is superior in alkali resistance and can lengthen lifetime of an organic EL device as well as can ensure a high work function suitable for an anode for a high-luminance, high-power-efficient organic EL device.

12 Claims, 7 Drawing Sheets

FOREIGN PATENT DOCUMENTS

| | | |
|---|---|---|
| JP | 2002-343579 A1 | 11/2002 |
| JP | 2005-310707 A1 | 11/2005 |
| JP | 2005-339992 A1 | 12/2005 |
| JP | 2006-331864 A1 | 12/2006 |
| JP | 2007-103098 A1 | 4/2007 |
| JP | 2007-234572 A1 | 9/2007 |
| JP | 2008-524853 A1 | 7/2008 |
| WO | 2004/076710 A1 | 9/2004 |

\* cited by examiner

ANODE STRUCTURE FOR USE IN ORGANIC EL DEVICE, PRODUCTION METHOD THEREOF AND ORGANIC EL DEVICE

CROSS-REFERENCE TO RELATED APPLICATION

This application claims priority to Japanese Patent Application No. 2009-184985 filed on Aug. 7, 2009, the entire content of which is incorporated herein by reference.

TECHNICAL FIELD

The present invention relates to an anode structure for use in a top-emission type organic EL device, a production method thereof, and an organic EL device.

BACKGROUND ART

In recent years, organic EL (electroluminescence) devices have been drawing attention as display devices such as mobile phone display panels or flat-screen televisions. In particular, top-emission type organic EL devices, in which light is emitted from the side opposite to a driving circuit board, are suitable for achieving high luminance and high definition, because the top-emission type devices can ensure a high aperture ratio with no restriction by light-blocking objects such as TFT (Thin Film Transistor) and a wiring, as compared with bottom-emission type organic EL devices, in which light is emitted from the side having a driving circuit board. In such top-emission type organic EL devices, it is the mainstream to use a structure in which a buffer layer made of ITO, IZO, AZO, $MoO_3$ or $V_2O_5$ is directly formed on the surface of an anode (reflective film) made of an Al alloy or an Ag alloy. In this way, the currently mainstream buffer layers contain oxygen, which is used as an oxide to constitute a buffer layer, so as to achieve a balance between work function and high transmission rate due to wide gap. In these oxide buffer layers, it is necessary to heighten the work function by subjecting the surface of the buffer layer to oxygen-plasma treatment, ozone treatment or the like so as to forcibly dope with oxygen.

However, the oxide buffer layer forcibly doped with oxygen causes a phenomenon in which oxygen gradually leaks out to lower the work function. Moreover, it is known that organic materials used in organic EL devices, such as a hole injection layer (2-TNATA), are sensitive to oxygen and water, under the presence of which organic layer properties deteriorate.

There is also known a technique for forming an insulating amorphous carbon film on an anode ITO film. For example, a technique is known in which the surface of an anode is flattened by forming an amorphous carbon layer on an ITO film to improve light emitting efficiency and light emitting stability (see Patent Literature 1). In this technique, the formation of the amorphous carbon film is conducted by sputtering during which a mixture gas of hydrogen and argon gas (with a hydrogen proportion of 5%) is flowed. In addition, there is also known a technique in which an insulating amorphous carbon film having a specific resistance of higher than 100 Ω·cm is provided on an anode to improve hole injection efficiency between the anode provided with the carbon film and an organic light emitting layer (see Patent Literature 2).

On the other hand, there is also known a technique in which a diamond-like carbon film electrode having a high electrical conductivity is formed by RF-PECVD on an anode such as an ITO film (see Patent Literature 3). However, this technique requires many steps in that it is necessary to dope the diamond-like carbon film with impurities for providing electrical conductivity as well as to terminate the surface of the diamond-like carbon film with fluorine or the like for heightening the work function by conducting an RF plasma treatment during which a gas such as $CF_4$ is introduced. Moreover, the diamond-like carbon film produced by this technique contains impurities or the like at a meaningful level, raising a concern with negative effects such that the impurities are diffused into the organic EL layer which is in direct contact with the diamond-like carbon film.

Figure 13:
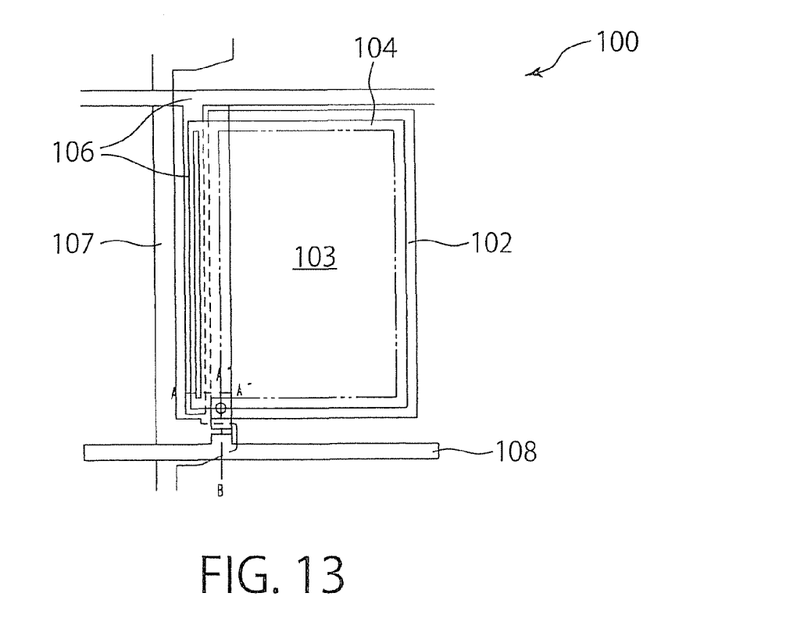
FIG. 13 is a top view of an organic EL device provided with a conventional auxiliary wiring.
Figure 14:
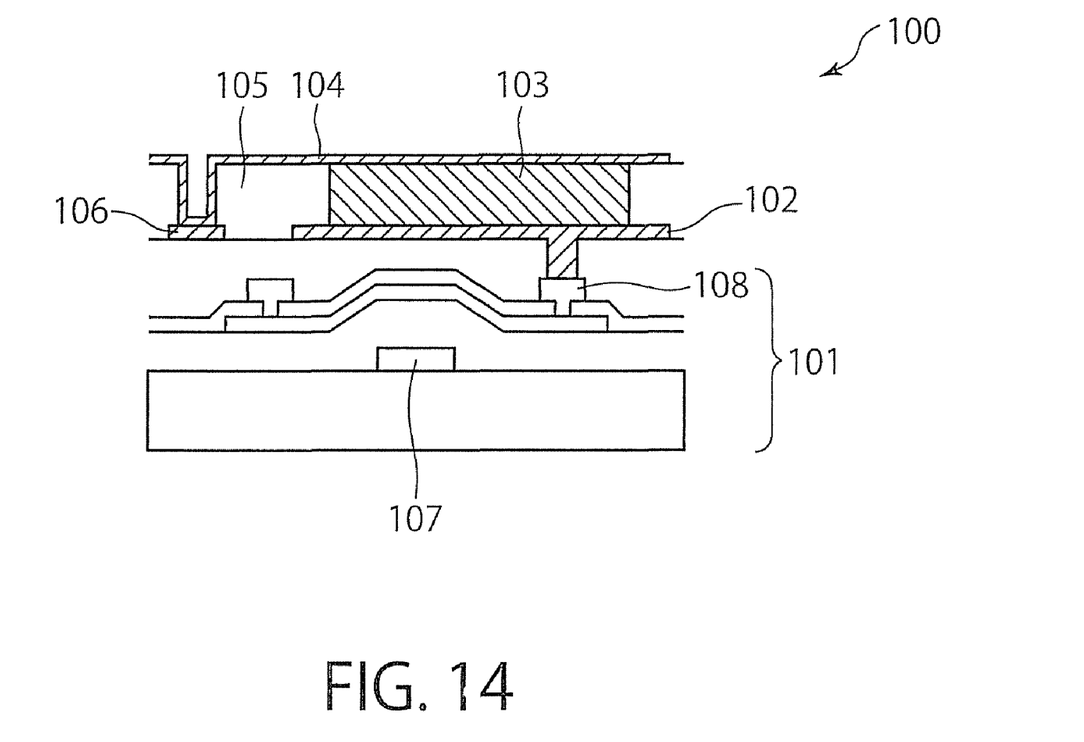
FIG. 14 is a cross-sectional view taken along line A-A'-B of the organic EL device shown in FIG. 13 (i.e., a combined view of the cross-sectional view taken along line A-A' and that along line A'-B.

In the meantime, a structure having an organic EL layer interposed between electrode materials is advantageous in terms of mass productivity and cost competitiveness of organic EL panels, while the decrease in cathode conductance becomes unignorable as the light emitting part becomes larger. This causes the necessity to increase the cathode conductance by connecting an auxiliary wiring to the cathode. An example of such conventional organic EL devices is shown in FIGS. 13 and 14. FIG. 13 shows a top view of the organic EL device, while FIG. 14 shows a cross-sectional view taken along line A-A'-B of FIG. 13 (i.e., a combined view of the cross-sectional view taken along line A-A' and that along line A'-B). As shown in FIG. 14, the organic EL device 100 has, on a driving circuit board 101, an anode (reflective film) 102 having a laminated structure in which a Mo/Ag or Ag alloy and a buffer layer such as ITO are laminated in order, an organic EL layer 103, and a cathode 104 made of a Mg—Ag alloy, all of which are laminated in order. In addition, at a location separated from the organic EL layer 103 by a flattening film 105, a downwardly-bent part of the cathode 104 is in direct contact with an auxiliary wiring 106 having a laminated structure in which a Mo/Al or Al alloy and a buffer layer made of a high-melting-point metal such as Mo are laminated in order. As shown in FIG. 13, the auxiliary wiring 106 is provided so as to be vertical and parallel to a gate wiring 107 and a source wiring 108 as well as to be parallel to the outer edge of the organic EL layer 103. This configuration of the auxiliary wiring 106 enables electrons to flow uniformly over the entire area of the organic EL layer 103. For such structure, a further improvement in productivity is desired, since the different laminated structures of the anode (reflective film) 102 and the auxiliary wiring 106 increase the types of the materials, complicate the process, and increase the number of the process steps.

CITATION LIST

Patent Literature

[PTL 1] Japanese Patent Laid-Open Publication No. H7-130468
[PTL 2] Japanese Patent Laid-Open Publication No. 2001-176663
[PTL 3] Japanese Patent Laid-Open Publication No. 2005-339992

SUMMARY OF INVENTION

The inventors have now found that it is possible to provide an anode structure which is superior in alkali resistance and can lengthen lifetime of an organic EL device as well as can ensure a high work function suitable for an anode for a high-luminance, high-power-efficient organic EL device by providing, on an anode layer made of a particular metal or alloy, a buffer layer made of an electrically conductive amorphous carbon having an extremely low hydrogen concentration. In addition, the inventors have also found that this anode structure can be used not only as an anode but also as an auxiliary wiring capable of establishing an ohmic contact with a cathode, depending on its patterning, and thus enables simultaneous formation of the anode and the auxiliary wiring so as to significantly simplify the process of producing the auxiliary wiring and the anode.

Thus, an object of the present invention is to provide an anode structure which is superior in alkali resistance and can lengthen lifetime of an organic EL device as well as can ensure a high work function suitable for an anode for a high-luminance, high-power-efficient organic EL device. In addition, another object of the present invention is to provide an anode structure which can be used not only as an anode but also as an auxiliary wiring capable of establishing an ohmic contact with a cathode, depending on its patterning, and thus to enables simultaneous formation of the anode and the auxiliary wiring so as to significantly simplify the process of producing the auxiliary wiring and the anode. According to the present invention, there is provided an anode structure for use in a top-emission type organic EL device, comprising a laminated structure comprising:

an anode layer made of at least one selected from the group consisting of aluminum, aluminum alloys, silver and silver alloys; and a buffer layer directly provided on the anode layer and made of an electrically conductive amorphous carbon having a hydrogen concentration of 15 at. % or less.

According to the present invention, there is also provided a top-emission type organic EL device, comprising:

a substrate;

the above anode structure provided on the substrate;

an organic EL layer provided on the buffer layer of the anode structure; and a cathode provided on the organic EL layer.

According to the present invention, there is further provided a method for producing an anode structure for use in a top-emission type organic EL device, comprising the steps of:

forming an anode layer made of at least one selected from the group consisting of aluminum, aluminum alloys, silver and silver alloys on a substrate by sputtering; and directly forming a buffer layer made of an electrically conductive amorphous carbon having a hydrogen concentration of 15 at. % or less on the anode layer by sputtering.

DESCRIPTION OF EMBODIMENTS

Anode Structure

The anode structure according to the present invention is used at least as an anode in top-emission type organic EL devices.

Figure 1:
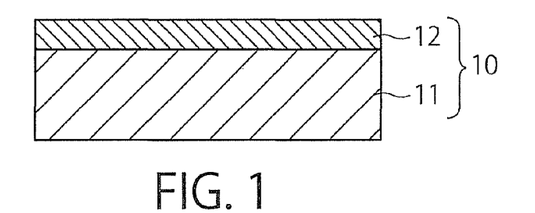
FIG. 1 is a schematic cross-sectional view of an anode structure according to the present invention.

In top-emission type organic EL devices, the anode also functions as a reflective film which reflects light emitted from an organic EL layer toward a cathode side. FIG. 1 shows a conceptual view of an anode structure according to the present invention. As shown in FIG. 1, the anode structure 10 has a laminated structure comprising an anode layer 11 and a buffer layer 12 which is directly provided on the anode layer 11 (i.e., the side which reflects light).

The anode layer 11 is made of at least one selected from the group consisting of aluminum, aluminum alloys, silver and silver alloys. These materials are suitable for a reflective film as having high light reflectance, and are superior in flatness when made into a thin film. In particular, aluminum or aluminum alloy is an inexpensive wiring material and is thus advantageous in an embodiment in which part of an anode structure is used as an auxiliary wiring for being brought into direct contact with the cathode. A wide variety of aluminum alloys and silver alloys can be used, which have a general alloy composition to be used as an anode or a wiring in display devices such as organic EL devices. Preferred examples of the aluminum alloy composition include Al—Ni, Al—Cu, Al—Ag, Al—Ce, Al—Zn, Al—B, Al—Ta, Al—Nd, Al—Si, Al—La, Al—Co, Al—Ge, Al—Fe, Al—Li, Al—Mg and Al—Mn alloys. Elements which constitute these alloys can be arbitrarily combined, depending on required properties. In addition, preferred examples of the silver alloy composition include Ag—Pd, Ag—Cu, Ag—Al, Ag—Zn, Ag—Mg, Ag—Mn, Ag—Cr, Ag—Ti, Ag—Ta, Ag—Co, Ag—Si, Ag—Ge, Ag—Li, Ag—B, Ag—Pt, Ag—Fe, Ag—Nd, Ag—La and Ag—Ce alloys. Elements which constitute these alloys can be arbitrarily combined, depending on required properties. The film thickness of the anode layer 11 is not particularly limited to, but is preferably 30 to 500 nm, more preferably 50 to 300 nm, further preferably 100 to 250 nm.

The buffer layer 12 is made of an electrically conductive amorphous carbon having a hydrogen concentration of 15 at. % or less, preferably, 12 at. % or less, more preferably 5 at. % or less. Although the lower limit of the hydrogen concentration is not limited and may be even zero, 3 at. % can be exemplified as a rough indication of the lower limit in consideration of hydrogen unavoidably incorporated due to sputtering environment or the like. Measurement of the hydrogen concentration in the buffer layer can be conducted with a variety of known methods, but is preferred to be conducted with HFS (Hydrogen Forward Scattering). In this way, by extremely lowering the hydrogen concentration to avoid decrease in electrical conductivity or generation of insulation property due to hydrogen termination of carbon constituting the buffer layer, it is possible to provide the buffer layer with an electrical conductivity high enough for use not only as an anode but also as an auxiliary wiring capable of establishing an ohmic contact with the cathode. Therefore, it is preferable that the electrically conductive amorphous carbon is substantially undoped with impurities other than carbon and hydrogen. The term "substantially undoped" herein means that impurities are not intentionally added for doping for the purpose of providing any function and that impurities unavoidably incorporated due to sputtering environment or the like are permitted. From this point of view, the electrically conductive amorphous carbon in the present invention preferably has an oxygen concentration of 0 to 300 ppm, a halogen element concentration of 0 to 1000 ppm, and a nitrogen concentration of 0 to 500 ppm. The film thickness of the buffer layer 12 is not particularly limited to, but is preferably 3 to 30 nm, more preferably 3 to 15 nm, further preferably 5 to 10 nm.

The surface of the buffer layer 12 preferably has an arithmetic average roughness Ra of 0 to 5 nm, more preferably 0 to 3 nm. The arithmetic average roughness Ra is defined in JIS B 0601-2001, and can be easily measured by using a commercially available roughness measuring apparatus such as an AFM scanning probe microscope. In this way, since the buffer layer in the anode structure of the present invention is formed on the anode layer essentially excellent in flatness, it is possible to lower the arithmetic average roughness Ra on the surface of the buffer layer and thus to achieve high flatness. This can reduce risk of short-circuit between organic EL layers due to generation of excessive unevenness. In addition, since there is no need to provide a hole injection layer and a hole transfer layer with large thicknesses for the purpose of eliminating the influence caused by the unevenness of the buffer layer surface, it is possible to thin the hole injection layer, the hole transfer layer, and the organic EL layer containing these layers, as compared to the conventional ones. As the result, it is possible to lower the production cost by reducing usage of extremely expensive organic materials as well as, to improve light-emitting efficiency by reducing the thickness of the organic EL layer.

There may be an oxidized film (not shown in the figures) between the anode layer 11 and the buffer layer 12. The oxidized film may be typically formed with the anode layer being unavoidably oxidized by oxygen in the atmosphere. The oxidized film is preferred to be as thin as possible, while a preferable thickness is 3.0 nm or less, more preferably 1.5 nm or less. Such an oxidized film may be removed by etching or the like.

The side of the anode layer 11 opposite to the buffer layer 12 may be supported by a substrate, which is included to call anode structure. The substrate may be made of an inorganic material such as glass or an organic material such as a resin. In addition, when an organic material such as a resin is used as a substrate, it is preferable to provide, as a primer layer, a molybdenum layer between the anode layer and the substrate so as to ensure adhesion to the anode layer.

Figure 2:
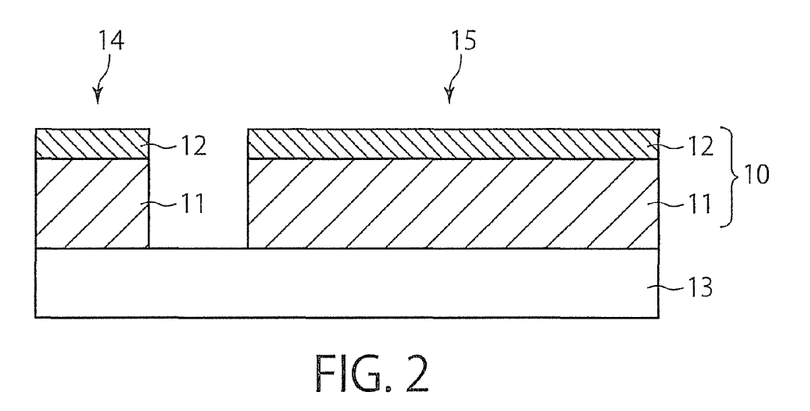
FIG. 2 is a schematic cross-sectional view of an anode structure provided with a shape of an auxiliary wiring and an anode according to the present invention.

According to a preferred embodiment of the present invention, as shown in FIG. 2, a plurality of laminated structures 14 and 15 are separately provided on the same plane provided by a substrate 13 or the like. At least one of the laminated structures 14 may have a shape as an auxiliary wiring for direct contact with the cathode of the organic EL device, while the other laminated structures 15 may have a shape as the anode of the organic EL device. In other words, according to the anode structure of the present invention, the anode layer 11 can be composed of a material which is suitable for a wiring, while a buffer layer 12 has an electrical conductivity high enough to establish an ohmic contact with the cathode. Thus, both of the auxiliary wiring 14 and the anode 15 can be formed simultaneously by providing a sheet of the anode structure 10 with a desired patterning.

Production Method

The anode structure used in the top-emission type organic EL device of the present invention can be produced as shown below.

At the outset, an anode layer made of at least one selected from the group consisting of aluminum, aluminum alloys, silver and silver alloys is formed on a substrate by sputtering. This sputtering is not particularly limited, but may be conducted with use of a target made of aluminum, an aluminum alloy, silver or a silver alloy, in accordance with the known techniques, such as DC sputtering, DC magnetron sputtering, RF sputtering and RF magnetron sputtering, as well as the known sputtering conditions.

A buffer layer made of an electrically conductive amorphous carbon having a hydrogen concentration of 15 at. % or less is then directly formed on the anode layer by sputtering. This sputtering is preferred to be conducted with use of a carbon-based target, such as graphite and glassy carbon, under an argon gas atmosphere with no hydrogen gas added. However, as far as the hydrogen concentration in the electrically conductive amorphous carbon constituting the buffer layer to be formed is 15 at. % or less, a trace amount of an additive gas, such as a hydrocarbon and hydrogen, is allowed to be incorporated into argon gas. The flow ratio of the additive gas to argon gas is preferably 0.4 vol. % or less, more preferably 0.2 vol. % or less. A large amount of an additive gas such as a hydrocarbon or hydrogen is not preferable because amorphous carbon is terminated with hydrogen to lower electrical conductivity and might have electrically insulating properties. The sputtering technique may be a known technique, such as DC sputtering, DC magnetron sputtering, RF sputtering or RF magnetron sputtering, and may be conducted in accordance with the known sputtering conditions.

According to a preferred embodiment of the present invention, in order to provide the anode structure with a shape of the auxiliary wiring and the anode, a step may be further conducted in which part of the laminated structure is removed by etching until the substrate is exposed to form a plurality of laminated structures separated from each other, so that at least one of the laminated structures is provided with a shape as the auxiliary wiring for direct contact with the cathode of the organic EL device and that the other laminated structures are provided with a shape as the anode of the organic EL device. The etching technique may be conducted in accordance with the known technique, such as dry etching, wet etching, and combination thereof. For example, after removing the buffer layer by dry etching, the anode layer may be removed by wet etching. In addition, determination of a region to be etched is not particularly limited but may be done in accordance with known technique such as photolithography patterning.

Organic EL Device

Figure 3:
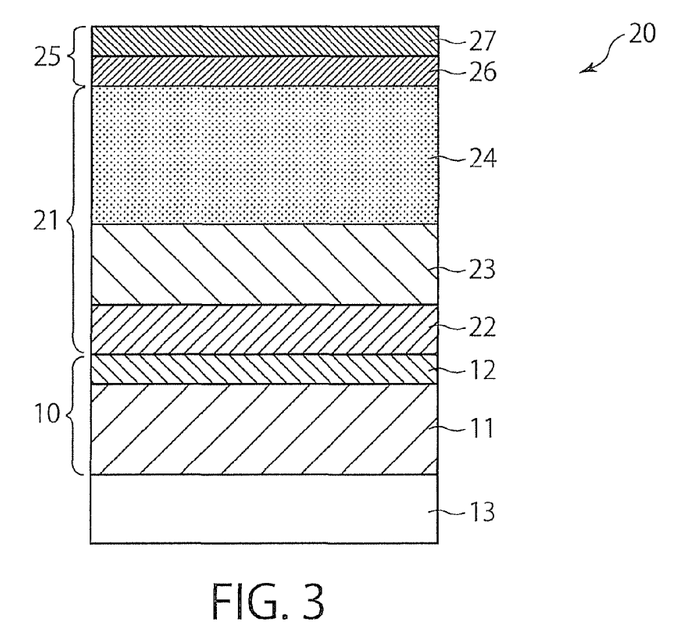
FIG. 3 is a schematic cross-sectional view of an organic EL device according to the present invention.

A top-emission type organic EL device can be constructed by using the anode structure according to the present invention. FIG. 3 schematically shows an example of the layer constitution of the top-emission type organic EL device according to the present invention. As shown in FIG. 3, an organic EL device 20 comprises a substrate 13, an anode structure 10 provided on the substrate 13, an organic EL layer 21 provided on a buffer layer 12 of the anode structure 10, and a cathode 25 provided on the organic EL layer 21.

A variety of known EL layer constitutions used for organic EL devices can be used as the organic EL layer 21, which comprises a hole injection layer 22 and/or a hole transfer layer 23, a light-emitting layer 24, and optionally an electron transfer layer and/or an electron injection layer (not shown in the figures) in order from the anode structure 10 to the cathode 25. As the hole injection layer, the hole transfer layer, the light-emitting layer, the electron transfer layer and the electron injection layer, those having a variety of known constitutions or compositions can be suitably used respectively, without being particularly limited. According to a preferred embodiment of the present invention, the organic EL layer 21 may be composed of the hole injection layer 22 comprising Alq3 (tris(8-hydroxyquinolinato)aluminum), the hole transfer layer 23 comprising α-NPD (4,4-bis[N-(1-naphthyl)-N-phenylamino]biphenyl), and the light-emitting layer 24 comprising 2-TNATA (4,4',4"-tris(N-(2-naphthyl)-N-phenylamino) triphenylamine).

Figure 4:
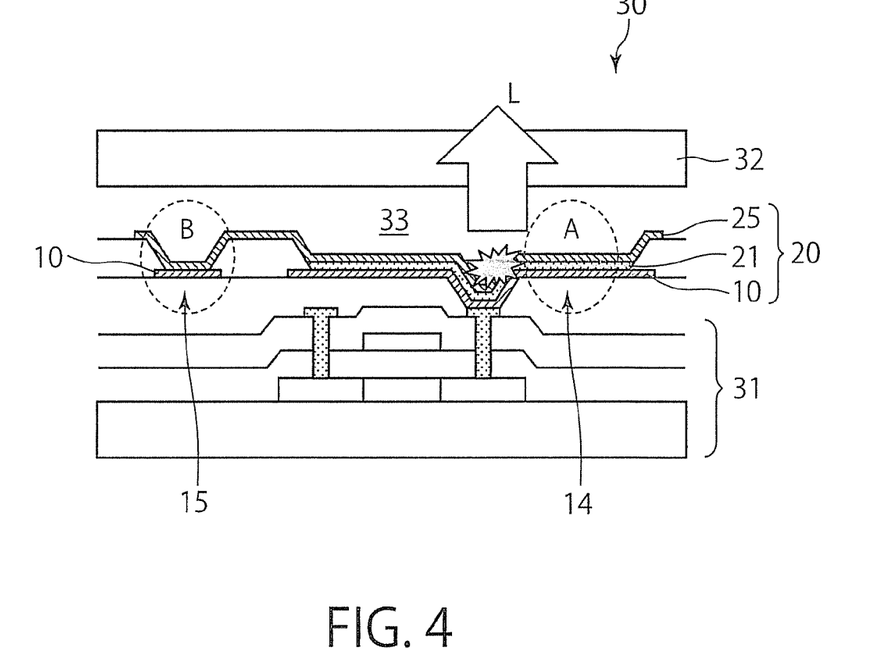
FIG. 4 is a schematic cross-sectional view of an organic EL display incorporating the organic EL device shown in FIG. 3, provided that the layer structure of the part denoted by A corresponds to that shown in FIG. 3.

An example of layer constitutions of the top-emission type organic EL display in which the organic EL device 20 is incorporated is shown in FIG. 4. In the organic EL display 30 shown in FIG. 4, the organic EL device 21 is electrically connectable to a driving circuit board 31 through the anode of the anode structure 10. A sealing glass 32 is provided above the cathode 25 to face the organic EL device 20, while a sealing resin 33 is filled between the sealing glass 32 and the organic EL device 20. Light L generated from the organic EL layer 21 is emitted to the outside through the cathode 25 and the glass substrate 32.

Figure 5:
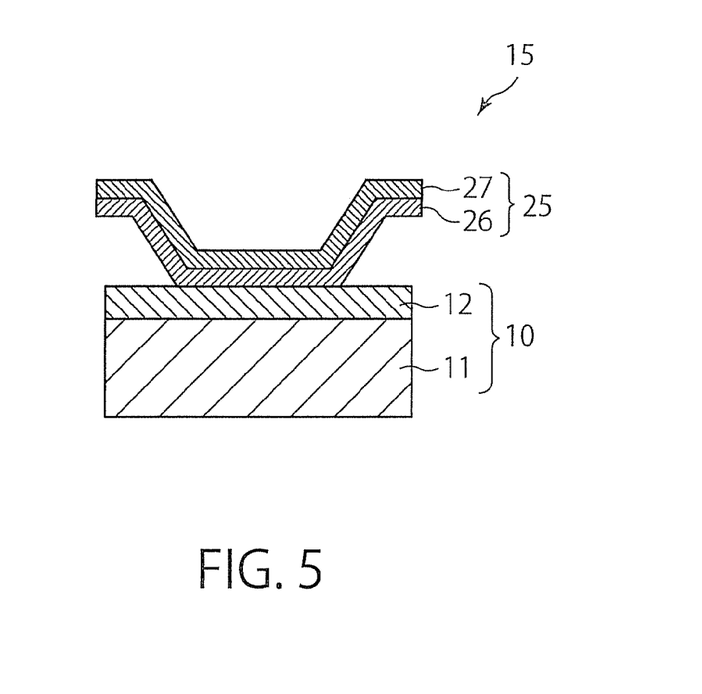
FIG. 5 is an enlarged schematic cross-sectional view of the direct contact part B between the auxiliary wiring and the cathode in the organic EL device shown in FIG. 3.

The anode structure 10 shown in FIG. 4 has not only the anode 14 but also an auxiliary wiring 15. In this embodiment, as shown in FIG. 5, which is an enlarged view of the area denoted as B in FIG. 4, the buffer layer 12 corresponding to the auxiliary wiring 15 is configured so as to be in direct contact with the cathode 25. That is, the anode structure of the present invention can be suitably used as an auxiliary wiring capable of establishing an ohmic contact with the cathode by providing a desired patterning.

As the cathode 25, a variety of known cathodes used in top-emission type organic EL devices can be used, with no particular limitation as far as the cathode is light transmissive or semi-transmissive, but a cathode with a low work function is preferable. According to a preferred embodiment of the present invention, a cathode composed of a Mg—Ag layer 26 laminated on an IZO layer 27 may be used, while the use of this Mg—Ag layer 26 in contact with the organic EL layer provides a high light transmittance and a low work function to improve luminance and power efficiency of the organic EL device. In addition, the anode structure of the present invention can be applied not only to active matrix displays having TFT (Thin Film Transistor) but also to passive matrix displays and even to organic EL devices for illumination having organic layers as light sources. In the case of passive matrix displays or organic EL devices for illumination, the anode structure of the present invention may be applied as an anode structure for which no auxiliary wiring is required.

EXAMPLES

The present invention is more specifically explained with reference to the following examples.

Example 1

Preparation and Evaluation of Anode Structure

Alkali-free glass (Corning #1737) was prepared as a substrate. An aluminum film with a thickness of 150 nm was formed on the substrate by sputtering. After an aluminum target (ACX manufactured by Mitsui Mining and Smelting Co., Ltd., 203 mm diameter×8 mm thickness) was placed in a multi-chamber-type magnetron sputtering apparatus (MSL-464, Tokki Corporation) connected to a cryopump, this sputtering was conducted under the conditions of an input power (DC) of 1000 W; an ultimate vacuum of $5\times10^{-5}$ Pa; a sputtering pressure of 0.5 Pa; an Ar flow rate of 100 sccm; and a substrate temperature of room temperature. Thus, an anode layer made of aluminum was formed.

An electrically conductive amorphous carbon film as a buffer layer was formed on the anode layer by sputtering. After a graphite target (1G-70 manufactured by Toyo Tanso Co., Ltd., 203.2 mm diameter×8 mm thickness) prepared by sintering graphite powder was placed in a multi-chamber-type magnetron sputtering apparatus (MSL-464, Tokki Corporation) connected to a cryopump, this sputtering was conducted under the conditions of an input power (DC) of 250 W (0.8 W/cm$^2$); an ultimate vacuum of $5\times10^{-5}$ Pa; a sputtering pressure of 0.5 Pa; an Ar flow rate of 100 sccm; and a substrate temperature of room temperature. At this time, in order to adjust the hydrogen concentration in the carbon film, $CH_4$ was added at a flow rate in the range of 0 sccm to 2 sccm with Ar, as required. By suitably adjusting the sputtering time, carbon films with different thicknesses shown in Table 1 and 2 were formed. $CH_4/Ar$ in Table 1 refers to partial pressure (Pa) of methane and is an index that indicates to what extent methane gas is comprised in terms of total pressure. In this way, buffer layers composed of electrically conductive amorphous carbons having various hydrogen concentrations were formed with various film thicknesses as shown in Table 1 and 2 to obtain various anode structures composed of anode layers and buffer layers.

The various anode structures obtained were subjected to the following evaluations:

Evaluation 1: Hydrogen Concentration Analysis in Carbon Film

The hydrogen concentration in the buffer layer of the anode structure was measured by RBS (Rutherford Backscattering Spectrometry) and HFS (Hydrogen Forward Scattering) techniques. These techniques have a feature that evaluation can be made quantitatively without using a standard sample. Specifically, as a measuring apparatus, 3S-R10 manufactured by NEC corporation and RBS-400 manufactured by CEA were used to conduct measurements in a measuring diameter in the range of 1 to 2 mm at an RBS detection angle of 160° and an HFS detection angle of 30°. The results obtained are shown in Table 1.

Evaluation 2: Evaluation on Electrical Conductivity

Figure 6:
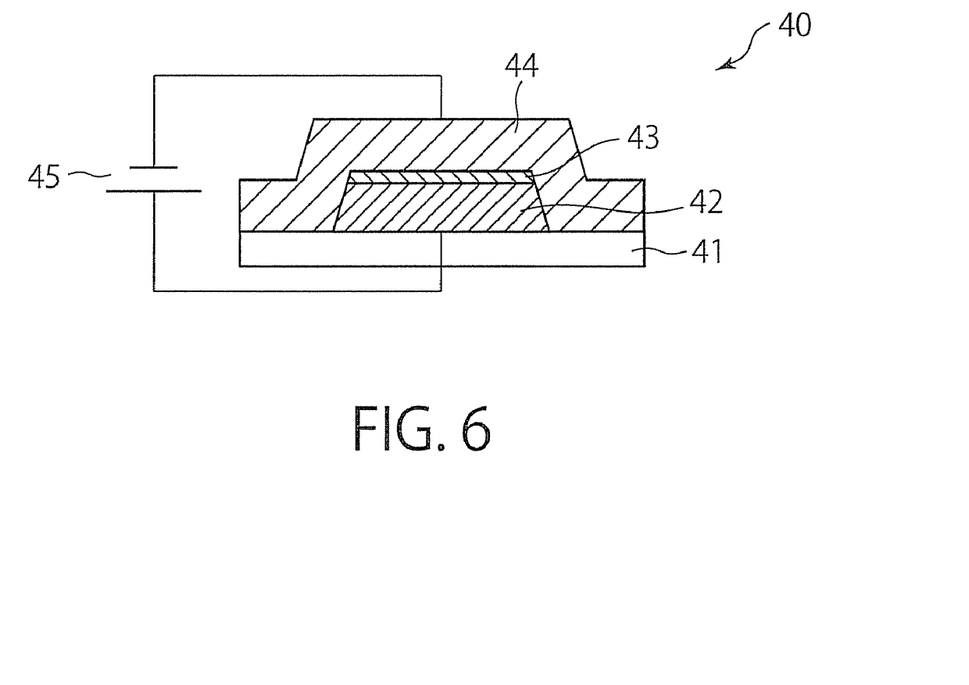
FIG. 6 is a schematic cross-sectional view showing a measuring system used for evaluating electrical conductivity in Example 1.

Electrical conductivity was evaluated on the anode structure by evaluating whether or not an ohmic contact with the cathode could be established. Specifically, a measuring system as shown in FIG. 6 was prepared. This measuring system 40 is prepared by forming by sputtering a 200-nm-thick cathode layer 44 composed of a Mg—Ag 30 wt % alloy to cover all the outermost surfaces of the substrate 41 and, formed thereon, an anode layer 42 and a buffer layer 43, with a measuring apparatus 45 (B1500A manufactured by Agilent Technologies Inc.) being connected between the cathode layer 44 and the anode layer 42. A current of ±100 μA was applied between the anode layer 42 and the cathode layer 44 by the measuring apparatus 45 to measure the voltage, followed by evaluation in which a sample based on which a graph of the relation between the measured current and voltage was turned out to be linear was regarded as capable of establishing an ohmic contact, which means that the electrical conductivity of the sample was good. The results obtained are shown in Table 1.

Evaluation 3: Evaluation on Surface Flatness

The center-line surface roughness Ra on the buffer layer of the anode structure was measured in the measurement area of 10 μm×10 μm square by using an AFM scanning probe microscope (manufactured by Nihon Veeco K.K.). The results obtained are shown in Table 1.

Evaluation 4: Evaluation on Reflectivity

The reflectance of the anode structure was measured by using a spectrophotometer (U-4100 manufactured by Hitachi High-Technologies Corporation). This measurement was conducted in relative comparison with a sample with no buffer layer laminated, of which the reflectance is supposed to be 100%. A relative reflectance of 50% or more at a measurement wave length of 550 nm is preferable, while a relative reflectance of 60% or more is more preferable. The results obtained are shown in Table 1.

Example 2

Figure 7:
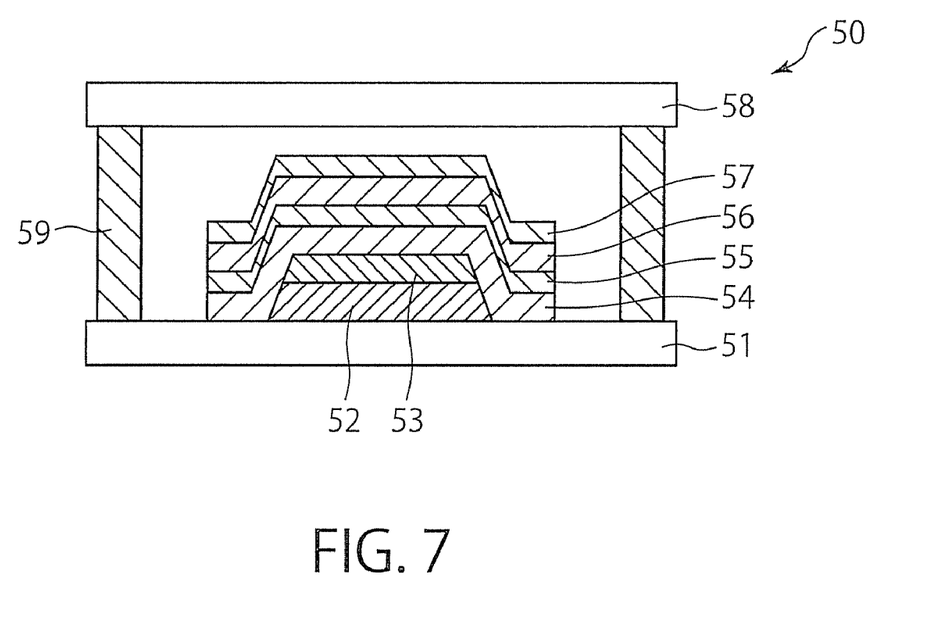
FIG. 7 is a schematic cross-sectional view of the organic EL device sample with a buffer layer prepared in Example 2.

Influence of Presence/Absence of Electrically Conductive Amorphous Carbon Buffer Layer on Properties In order to investigate influence of presence/absence of the electrically conductive amorphous carbon buffer layer on properties, an ITO film was used as an anode layer to prepare an organic EL device with a structure shown in FIG. 7 in which an electrically conductive amorphous carbon buffer layer was formed on the anode layer. The reason why light-transmissive ITO film was used as an anode layer instead of a reflective film such as Al film was to conduct the experiment easily in a simplified manner, not to mention that the evaluation result of the electrically conductive amorphous carbon buffer layer in this example is also applicable to the present invention directed to a top-emission type organic EL device. Specifically, an organic EL device 50 shown in FIG. 7 has a laminated structure in which, on a glass substrate 51, an ITO anode layer 52, an electrically conductive amorphous carbon buffer layer 53, a hole injection layer 54 made of 2-TNATA, a hole transfer layer 55 made of α-NPD, a light-emitting layer

TABLE 1

| CH$_4$/Ar (Pa) | H$_2$ Concentration (at. %) | Electrical Conductivity Film Thickness 7 nm | Surface Roughness Ra Film Thickness 7 nm | Relative Reflectance | | | | |
|---|---|---|---|---|---|---|---|---|
| | | | | Film Thickness 3 nm | Film Thickness 7 nm | Film Thickness 15 nm | Film Thickness 25 nm | Film Thickness 31 nm |
| 0 | 3.5 | Good | 0.55 nm | 96% | 90% | 65% | 51% | 43% |
| 7.6 × 10$^{-4}$ | 6.8 | Good | 0.42 nm | 96% | 91% | 68% | 53% | 45% |
| 1.1 × 10$^{-3}$ | 11.5 | Good | 0.35 nm | 97% | 92% | 70% | 55% | 47% |
| 1.9 × 10$^{-3}$ | 17.5 | Poor | 0.41 nm | 97% | 92% | 72% | 58% | 53% |
| 3.8 × 10$^{-3}$ | 23.1 | Poor | 0.39 nm | 97% | 93% | 75% | 65% | 61% |
| 7.5 × 10$^{-3}$ | 34.7 | Poor | 0.33 nm | 98% | 95% | 80% | 72% | 70% |

Evaluation 5: Measurement of Work Function

The work function was measured on the anode structures having the buffer layers of different thicknesses in the range of 0 to 15 nm by using a photoelectron spectroscopy (AC-3 manufactured by Riken Keiki Co., Ltd.) in the atmosphere. A work function of 5 eV or more is preferable.

Evaluation 6: Evaluation on Alkali Resistance

The anode structures having the buffer layers of different thicknesses in the range of 0 to 15 nm were directly immersed in a developing solution (TMAH 2.38%, 23° C.) for 2 minutes, followed by measuring the number densities of pinholes which generated in the anode layers (aluminum film). Number density of pinholes of 5 mm$^{-2}$ or less was evaluated as being good. The number density of pinholes before the TMAH immersion was about 0.1 mm$^{-2}$ or less.

56 made of Alq3, and a cathode layer 57 made of Mg—Ag are laminated in order. Above this laminated structure, a sealing glass 58 is provided to face the glass substrate 51, and is fixed to the glass substrate 51 via sealant spacers 59 located separately from the laminated structure. The sealing glass 58 and the sealant spacers 59 are configured to enclose the laminated structure and its periphery. As a result, the periphery of the laminated structure is hollow.

This organic EL device was prepared as shown below. At the outset, an ITO film with a thickness of 150 nm was formed as an anode layer on a glass substrate (Corning #1737 (30 mm square×0.7 mm thickness)). In this regard, since the glass substrate was as small as 30 mm square, the substrate was attached to another substrate having a size of 370×470 mm by using Kapton™ tape, before the formation of the ITO film.

TABLE 2

| CH$_4$/Ar (Pa) | H$_2$ Concentration (at. %) | Work Function (eV) | | | | Alkali Resistance | | | |
|---|---|---|---|---|---|---|---|---|---|
| | | Film Thickness 0 nm | Film Thickness 3 nm | Film Thickness 7 nm | Film Thickness 15 nm | Film Thickness 0 nm | Film Thickness 3 nm | Film Thickness 7 nm | Film Thickness 15 nm |
| 0 | 3.5 | 4.03 | 5.48 | 5.56 | 5.55 | Dissolved (Many Pinholes) | Pinholes of 2 mm$^{-2}$ | Pinholes of <0.1 mm$^{-2}$ | Pinholes of <0.1 mm$^{-2}$ |
| 1.1 × 10$^{-3}$ | 11.5 | | Not Measured | 5.60 | Not Measured | | | Not Measured | |
| 7.5 × 10$^{-3}$ | 34.7 | | | 5.50 | | | | | |

After an ITO target (710×630 mm) was placed in a magnetron sputtering apparatus (SMD-450 manufactured by Ulvac, Inc.) connected to a cryopump, this sputtering was conducted under the conditions of an input power (DC) of 2 kW (0.6 W/cm$^2$); an ultimate vacuum of $5\times10^{-5}$ Pa; a sputtering pressure of 0.6 Pa; an Ar flow rate of 100 sccm; an H$_2$O flow rate of 2 sccm; and a substrate temperature of room temperature.

An electrically conductive amorphous carbon film having a thickness of 7 nm was formed as a buffer layer on the ITO anode layer by sputtering. After a graphite target (1G-70 manufactured by Toyo Tanso Co., Ltd., 203.2 mm diameter×8 mm thickness) prepared by sintering graphite powder was placed in a multi-chamber type magnetron sputtering apparatus (MSL-464 manufactured by Tokki Corporation) connected to a cryopump, this sputtering was conducted under the conditions of an input power (DC) of 250 W (0.8 W/cm$^2$); an ultimate vacuum of $5\times10^{-5}$ Pa; a sputtering pressure of 0.5 Pa; an Ar flow rate of 100 sccm; and a substrate temperature of room temperature.

The laminated film thus obtained was subjected to photolithography patterning. At the outset, a positive type resist of TFR-970 (manufactured by Tokyo Ohka Kogyo Co., Ltd.) was applied on the substrate. The application of the resist was conducted with a spin coater at 3000 rpm so that the thickness of the resist could reach about 1.5 µm. A prebake was then conducted on a hot plate at 110° C. for 1.5 minutes, followed by a UV exposure in an amount of 35 mJ/cm$^2$ through a Cr mask designed for forming an organic EL device in FIG. 7. A developing solution (TMAH 2.38%, 23° C.) was prepared to conduct a developing treatment for 1 minute by dip system. After removing the developing solution sufficiently with deionized (DI) running water, a postbake was conducted on a hot plate at 110° C. for 3 minutes.

The electrically conductive amorphous carbon buffer layer was then removed by dry etching. This dry etching was conducted by using a dry etching apparatus (10NR manufactured by Samco, Inc.) under the conditions of CF$_4$/O$_2$ gas ratio of 50/60 sccm; an RF of 50 W; a pressure of 5 Pa; and an etching time of 25 seconds. Subsequently, wet etching was conducted on the laminate to remove the ITO anode layer. This wet etching was conducted by using an oxalic-acid-based etching solution (ITO-07N manufactured by Kanto Chemical Co., Ltd.) under the conditions of an etching solution temperature of 40° C.; and an etching time of 3 minutes, followed by rinsing with deionized (DI) water for 3 minutes.

A stripping solution of TST-AQ8 (manufactured by Tokyo Ohka Kogyo Co., Ltd.) was used to remove the resist. The stripping was conducted at a solution temperature of 40° C. for 5 minutes, and then for 3 minutes with deionized (DI) water running. A crystallization heat treatment was then conducted on a hot plate at 250° C. for 30 minutes to crystallize ITO. The center-line surface roughness Ra on the laminate of the electrically conductive amorphous carbon and ITO was measured by using an AFM manufactured by Nihon Veeco K.K., and was found to be in the range of 0.6 to 1.0 nm.

After cleansing the laminated substrate by UV exposure, an organic EL layer and a cathode layer were laminated in a vapor deposition apparatus by forming 2-TNATA (30 nm), α-NPD (50 nm), Alq3 (50 nm), and Mg—Ag (Ag: 30 wt. %) (100 nm) in this order. At this time, vapor deposition was conducted only around the light-emitting part through the metal mask. Then, without being released to the air, the laminated substrate was transferred into a glove box, which was connected to the vapor deposition apparatus and was filled with an inactive gas (Ar), followed by sealing with a glass plate and a sealant. Thus, the organic EL device (hereinafter, Sample 1) shown in FIG. 7 was obtained.

Figure 8:
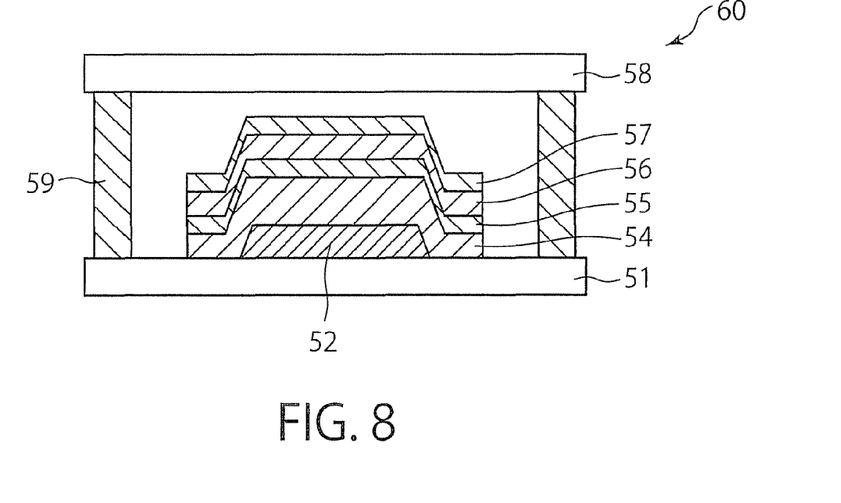
FIG. 8 is a schematic cross-sectional view of the organic EL device sample with no buffer layer prepared in Example 2.

In addition, for comparison, an organic EL device (hereinafter, Sample 2) shown in FIG. 8 was prepared in the same manner as Sample 1, except that an electrically conductive amorphous carbon film was not prepared, that dry etching was not conducted, and that oxygen ashing was conducted after the crystallization heat treatment at 250° C. for 30 minutes. The organic EL device 60 shown in FIG. 8 has the same structure as the organic EL device 50 shown in FIG. 8, except that there is no buffer layer 53. Furthermore, for comparison, an organic EL device (hereinafter, Sample 3) shown in FIG. 8 was also prepared in the same manner as Sample 2, except that the oxygen ashing was not conducted. A crystallization heat treatment was conducted at 250° C. for 30 minutes, the center line surface roughness Ra was measured on the ITO samples (Sample 2 and 3) free from electrically conductive amorphous carbon, and was found to be in the range of 0.6 to 0.8 nm.

Evaluation 1: Light-Emitting Luminance

Figure 9:
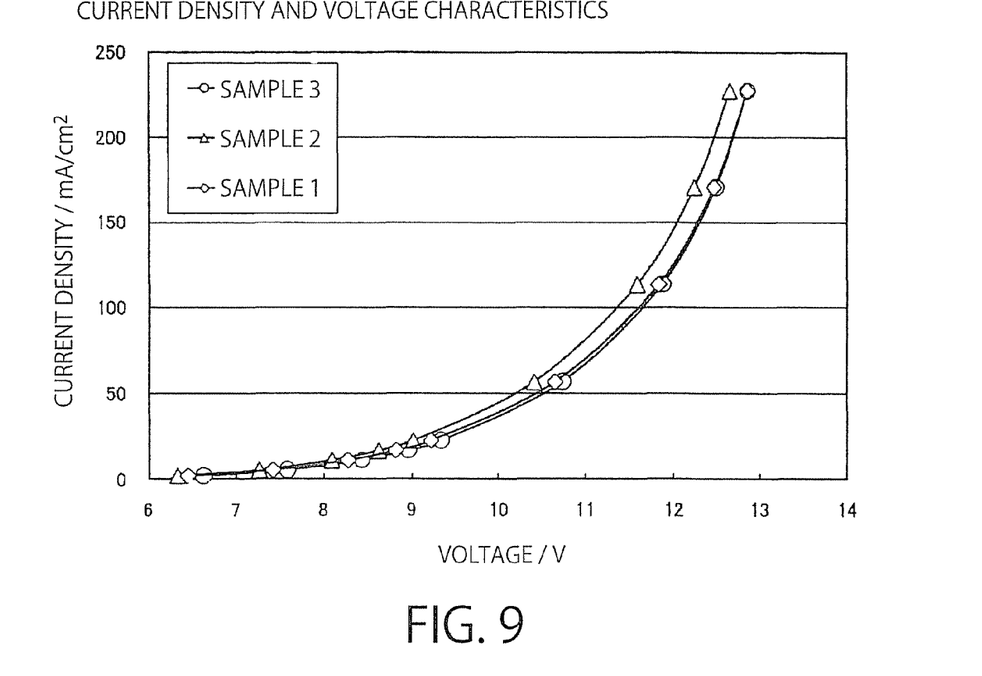
FIG. 9 is a graph showing the relation between current density and voltage characteristics measured in Example 2.
Figure 10:
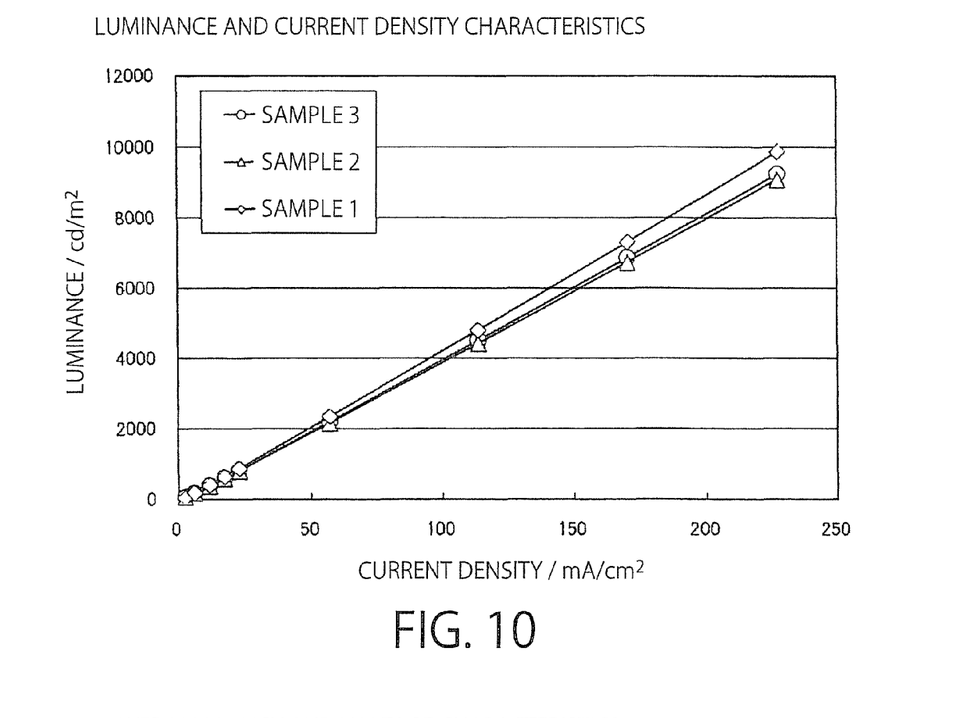
FIG. 10 is a graph showing the relation between luminance and current density characteristics measured in Example 2.

Light-emitting measurement was conducted by applying a negative DC potential to the side of the cathode layer 57 and applying a positive DC potential to the side of the anode layer 52/the buffer layer 53. A DC power supply was used to applying voltage to each sample for emitting light, the luminance of which was measured by a spectroradiometer. The results obtained are shown in Table 3. In addition, a graph of the relation between current density and voltage characteristics is shown in FIG. 9, while a graph of the relation between luminance and current density characteristics is shown in FIG. 10.

Evaluation 2: Power Efficiency

Figure 11:
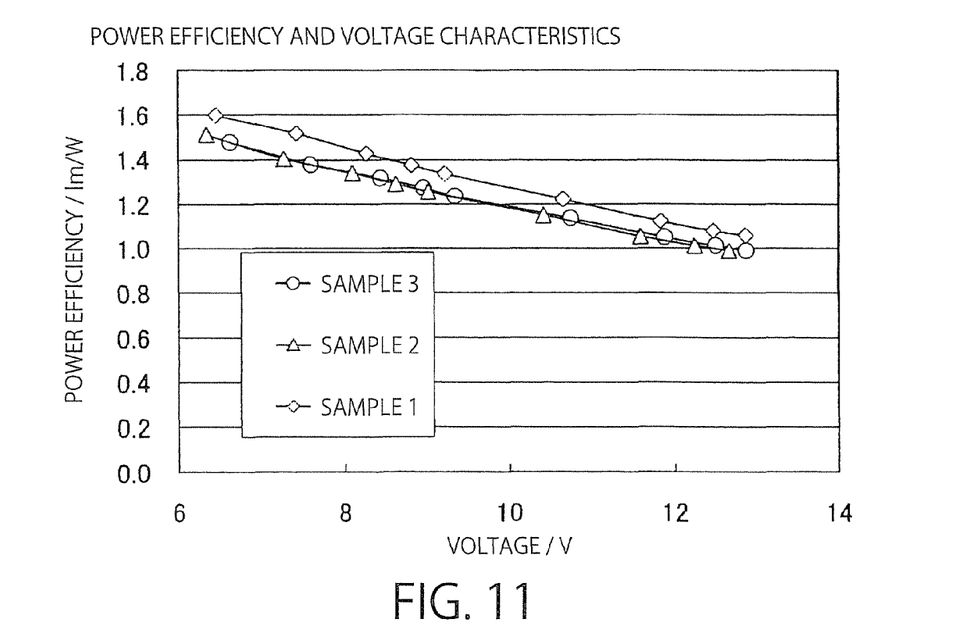
FIG. 11 is a graph showing the relation between power efficiency and voltage characteristics measured in Example 2.
Figure 12:
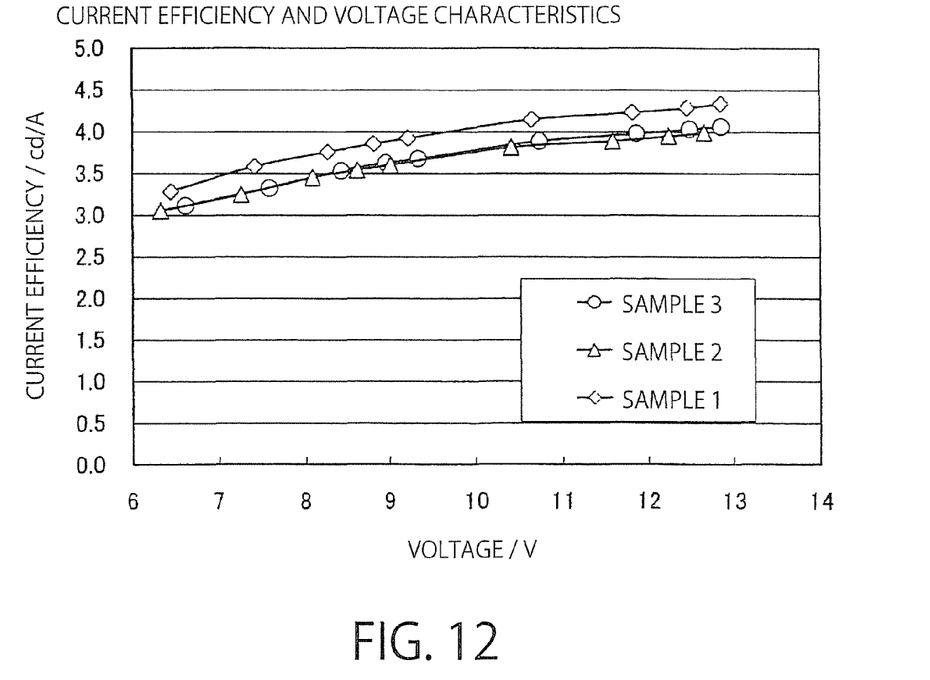
FIG. 12 is a graph showing the relation between current efficiency and voltage characteristics measured in Example 2.

Power efficiency was calculated by measuring the value of the current which flowed when the voltage was applied in Evaluation 1. The results obtained are shown in Table 3. In addition, a graph of the relation between power efficiency and voltage characteristics is shown in FIG. 11, while a graph of the relation between current efficiency and voltage characteristics graph is shown in FIG. 12.

Evaluation 3: Half-Life Characteristic (Relative Comparison to Sample 3)

Half-life was measured by measuring time for which luminance becomes the half of its initial light-emission.

TABLE 3

| | Anode Configuration | Light-Emitting Luminance cd/m$^2$ (12.5 V applied) | Power Efficiency 1 m/W | Half-Life |
|---|---|---|---|---|
| Sample 1 (Reference) | ITO Layer + Buffer Layer | 1.06 | 1.09 | 2.5 |
| Sample 2 (Comparison) | ITO Layer Alone (with Oxygen Ashing) | 0.98 | 1 | 0.98 |
| Sample 3 (Comparison) | ITO Layer Alone (without Oxygen Ashing) | 1 | 1 | 1 |

From the results of Evaluations 1 to 3 shown in FIGS. 9 to 12, it is found that providing a buffer layer 53 made of an electrically conductive amorphous carbon contributes to higher luminance, superior power efficiency and superior current efficiency, as compared to the anode 52 alone.

The invention claimed is:

1. An anode structure for use in a top-emission type organic EL device, comprising a laminated structure comprising:
   an anode layer made of at least one selected from the group consisting of aluminum, aluminum alloys, silver and silver alloys, wherein the anode layer also functions as a reflective film; and
   a buffer layer directly provided on the anode layer and made of an electrically conductive amorphous carbon having a hydrogen concentration of 15 at. % or less, wherein the buffer layer has a thickness of 3 to 30 nm.

2. The anode structure according to claim 1, wherein the electrically conductive amorphous carbon is substantially undoped with impurities other than carbon and hydrogen.

3. The anode structure according to claim 1, wherein the anode layer is made of aluminum or an aluminum alloy.

4. The anode structure according claim 1, having an oxidized film between the anode layer and the buffer layer.

5. The anode structure claim 1, wherein a plurality of the laminated structures are separately provided on a same plane, wherein at least one of the laminated structures has a shape as an auxiliary wiring for direct contact with a cathode of the organic EL device, wherein the other laminated structures have a shape as an anode of the organic EL device.

6. A top-emission type organic EL device, comprising
   a substrate;
   the anode structure according to claim 1 provided on the substrate;
   an organic EL layer provided on the buffer layer of the anode structure; and
   a cathode provided on the organic EL layer.

7. A top-emission type organic EL device, comprising:
   a substrate;
   the anode structure according to claim 5 provided on the substrate;
   an organic EL layer provided on the buffer layer of the anode structure; and
   a cathode provided on the organic EL layer;
   wherein the buffer layer of the laminated structure as the auxiliary wiring is in direct contact with the cathode.

8. The organic EL device according to claim 6, wherein the organic EL layer comprises a hole injection layer and/or a hole transfer layer, a light emitting layer, and optionally an electron transfer layer and/or an electron injection layer, in order from the anode structure to the cathode.

9. A method for producing an anode structure for use in a top-emission type organic EL device, comprising the steps of:
   forming an anode layer made of at least one selected from the group consisting of aluminum, aluminum alloys, silver and silver alloys on a substrate by sputtering, wherein the anode layer also functions as a reflective film; and
   directly forming a buffer layer made of an electrically conductive amorphous carbon having a hydrogen concentration of 15 at. % or less on the anode layer by sputtering, wherein the buffer layer has a thickness of 3 to 30 nm.

10. The method according to claim 9, further comprising the step of removing part of the laminated structure by etching until the substrate is exposed to form a plurality of laminated structures separated from each other, so that at least one of the laminated structures is provided with a shape as an auxiliary wiring for direct contact with a cathode of the organic EL device and that the other laminated structures are provided with a shape as an anode of the organic EL device.

11. The anode structure according to claim 1, wherein the anode layer has a thickness of 100 to 500 nm.

12. The method according to claim 9, wherein the anode layer has a thickness of 100 to 500 nm.

* * * * *